United States Patent
Takeda et al.

(10) Patent No.: US 11,834,737 B2
(45) Date of Patent: Dec. 5, 2023

(54) TITANIUM ALLOY COATING FILM AND TITANIUM ALLOY TARGET MATERIAL

(71) Applicant: DAIDO STEEL CO., LTD., Nagoya (JP)

(72) Inventors: Hiromasa Takeda, Miyagi (JP); Wataru Araki, Miyagi (JP); Kazuya Sakaguchi, Nagoya (JP); Katsuko Ofuji, Nagoya (JP); Jun Totsuka, Nagoya (JP); Kazuki Minami, Nagoya (JP)

(73) Assignee: DAIDO STEEL CO., LTD., Nagoya (JP)

( * ) Notice: Subject to any disclaimer, the term of this patent is extended or adjusted under 35 U.S.C. 154(b) by 1336 days.

(21) Appl. No.: 16/089,241

(22) PCT Filed: Mar. 29, 2017

(86) PCT No.: PCT/JP2017/012810
§ 371 (c)(1),
(2) Date: Sep. 27, 2018

(87) PCT Pub. No.: WO2017/170639
PCT Pub. Date: Oct. 5, 2017

(65) Prior Publication Data
US 2020/0308689 A1    Oct. 1, 2020

(30) Foreign Application Priority Data

Mar. 29, 2016  (JP) ................. 2016-066573
Mar. 23, 2017  (JP) ................. 2017-057131

(51) Int. Cl.
C23C 14/00    (2006.01)
C23C 14/06    (2006.01)
(Continued)

(52) U.S. Cl.
CPC .......... *C23C 14/0641* (2013.01); *C22C 14/00* (2013.01); *C23C 14/3414* (2013.01)

(58) Field of Classification Search
CPC . C22C 14/00; C23C 14/0635; C23C 14/0641; C23C 14/325; C23C 14/3414
(Continued)

(56) References Cited

U.S. PATENT DOCUMENTS 7,837,929 B2    11/2010   Gaydos et al.
8,911,528 B2    12/2014   Gaydos et al.
(Continued)

FOREIGN PATENT DOCUMENTS

CN    101360576 A    2/2009
JP    H 09-071856 A   3/1997
(Continued)

OTHER PUBLICATIONS

NPL-1: Zhang et al, Effects of Mo content on microstructure and corrosion resistance of arc ion plated Ti—Mo—N films on 316L stainless steel as bipolar plates for polymer exchange membrane fuel cells, Journal of power sources 253 (2014) pp. 201-204. (Year: 2014).*

(Continued)

*Primary Examiner* — Jie Yang
(74) *Attorney, Agent, or Firm* — MCGINN I.P. LAW GROUP, PLLC

(57) ABSTRACT

The titanium alloy coating film of the present invention is represented by $(Ti_{1-a}Mo_a)_{1-x}N_x$, which satisfies 0.04≤a≤0.32 and 0.40≤x≤0.60 and in which the film hardness thereof satisfies at least a condition of 3,000 HV or more; and the titanium alloy target material is represented by $Ti_{1-a}Mo_a$, which satisfies 0.04≤a≤0.32, and in which, when an X-ray diffraction profile is measured on a surface of the target material, a diffraction peak intensity attributed to a single metal phase of Mo is not detected.

6 Claims, 18 Drawing Sheets

(51) Int. Cl.
    *C23C 14/34*     (2006.01)
    *C22C 14/00*     (2006.01)

(58) Field of Classification Search
    USPC .......................................................... 420/421
    See application file for complete search history.

(56) References Cited

U.S. PATENT DOCUMENTS

| | | |
|---|---|---|
| 2007/0089984 A1 | 4/2007 | Gaydos et al. |
| 2008/0314737 A1 | 12/2008 | Gaydos et al. |
| 2011/0097236 A1 | 4/2011 | Gaydos et al. |

FOREIGN PATENT DOCUMENTS

| | | | |
|---|---|---|---|
| JP | 2009-513823 A | 4/2009 |
| JP | 2009-287063 A | 12/2009 |
| WO | WO 2009/025112 A1 | 2/2009 |

OTHER PUBLICATIONS

NPL: on-line translation of WO 2009025112 A1, Feb. 2009 (Year: 2009).*
Chinese Office Action, dated Dec. 25, 2019, in Chinese Application No. 201780021664.8 and English Translation thereof.
Korean Office Action, dated Apr. 20, 2020, in Korean Application No. 10-2018-7028133 and English Translation thereof.
Taiwanese Office Action, dated Oct. 31, 2017, in Taiwanese Application No. 10621113060 and English Translation thereof.
International Search Report (ISR) (PCT Form PCT/ISA/210), in PCT/JP2017/012810, dated Jul. 4, 2017, and English Translation thereof.
Written Opinion of the International Searching Authority (WOSA) (PCT Form PCT/ISA/237), in PCT/JP2017/012810, dated Jul. 4, 2017 and English Translation thereof.
Chinese Office Action, dated Sep. 10, 2020, in Chinese Application No. 201780021664.8 and English Translation thereof.
Japanese Office Action, dated Sep. 23, 2020, in Japanese Application No. 2017-057131 and English Translation thereof.

* cited by examiner

REFLECTED ELECTRON (SMELTING)

(I) SMELTING, MATRIX LAYER (II) SMELTING, WHITE

REFLECTED ELECTRON (POWDER SINTERING)

(III) POWDER SINTERING, MATRIX LAYER (IV) POWDER SINTERING, WHITE

CRACKS

STREAKY SCRATCHES
*RESULTING FROM TRANSFER OF CRACKS OF PUNCH DURING PROCESSING

TITANIUM ALLOY COATING FILM AND TITANIUM ALLOY TARGET MATERIAL

TECHNICAL FIELD

The present invention relates to a titanium alloy coating film and a titanium alloy target material.

BACKGROUND ART

As a method for increasing the life and functionality of tools or molds, a technique of coating a surface of a tool or mold with a hard coat such as TiC, TiN and TiAlN is widely known (see, for example, Patent Document 1).

BACKGROUND ART DOCUMENT

Patent Document

Patent Document 1: JP-A-9-071856

SUMMARY OF THE INVENTION

Problems that the Invention is to Solve

Nowadays, in the field of automotive industry, for example, at the time of forging of a high tensile steel by cold working, processing difficult to be coped with by cold working is increasing, and this brings about a situation where the working temperature must be accordingly raised in warm working or hot working. A rise in the working temperature is disadvantageous in view of dimensional accuracy or strength of the finished article and therefore, it is sufficiently meaningful to keep the working temperature low, which is, however, premised on achieving life enhancement of a manufacturing component related to a mold. In turn, development of a coating film requiring a low production cost while meeting the requirement for life enhancement is demanded.

As a result of focusing attention on a Ti—Mo alloy in view of versatility such as ease of coating to achieve high functionality of the coating film and cost, the present inventors have found nitride film, carbide film and carbonitride film of a Ti—Mo alloy, which are excellent in hardness and adhesiveness compared with the conventional coating film of TiN or TiAlN and can therefore favorably achieve life enhancement of a manufacturing component, and concomitantly, succeeded in developing a Ti—Mo alloy as a suitable target material for producing a coating film fulfilling the above-described properties. Incidentally, Patent Document 1 below discloses a technique of using Ti-50Mo (wt %) as the target material and obtaining a coating film having a composition of TiN+30% Mo (vol %) by an AIP method. However, the coating film based on this technique is a mixed structure of TiN as a metal compound phase and Mo as a metal phase and in this point, greatly differs from the composition of the present invention providing substantially a Ti—Mo alloy structure (solid solution) as a whole, and the coating film of the conventional composition has a problem that Mo with low hardness reduces hardness of the entire coating film (to a hardness of about 1,700 HV), making it impossible to achieve life enhancement of a manufacturing component.

Under these circumstances, the present invention has been made, and an object of the present invention is to provide a titanium alloy coating film ensuring excellent versatility in achieving high functionality of the coating film, moreover having excellent hardness and adhesiveness, and therefore, being capable of successfully achieving life enhancement of a manufacturing component, and a titanium alloy target material used therefor.

Means for Solving the Problems

The first titanium alloy coating film of the present invention is a titanium alloy coating film represented by $(Ti_{1-a}Mo_a)_{1-x}N_x$, in which each of a and x represents an atom ratio, the titanium alloy coating film as a whole satisfies $0.04 \leq a \leq 0.32$ and $0.40 \leq x \leq 0.60$, and a film hardness of the titanium alloy coating film satisfies at least a condition of 3,000 HV or more.

The second titanium alloy coating film of the present invention is a titanium alloy coating film represented by $(Ti_{1-a}Mo_a)_{1-y}C_y$, in which each of a and y represents an atom ratio, the titanium alloy coating film as a whole satisfies $0.04 \leq a \leq 0.32$ and $0.40 \leq y \leq 0.60$, and a film hardness of the titanium alloy coating film satisfies at least a condition of 3,000 HV or more.

The third titanium alloy coating film of the present invention is a titanium alloy coating film represented by $(Ti_{1-a}Mo_s)_{1-x-y}C_yN_x$, in which each of a, x and y represents an atom ratio, the titanium alloy coating film as a whole satisfies $0.04 \leq a \leq 0.32$, $0.20 \leq x, y \leq 0.40$, and $0.40 \leq 1-x-y \leq 0.60$, and a film hardness of the titanium alloy coating film satisfies at least a condition of 3,000 HV or more.

Additionally, a titanium alloy target material of the present invention is a titanium alloy target material represented by $Ti_{1-a}Mo_a$, in which a represents an atom ratio satisfying $0.04 \leq a \leq 0.32$, and when an X-ray diffraction profile is measured on a surface of the titanium alloy target material, a diffraction peak intensity attributed to a single metal phase of Mo is not detected.

Advantages of the Invention

According to the first titanium alloy coating film of the present invention, a coating film having good adhesiveness to a base metal can be obtained while realizing hardness comparable to TiAlN. According to the second and third titanium alloy coating films of the present invention, although the coating layer needs to be formed as a multilayer or an inclined layer so as to increase the adhesiveness to the base metal, a coating film having far excellent hardness compared with TiAlN can be obtained. In all of the first to third titanium alloy coating films, (Ti—Mo) is the main alloy structure (solid solution structure), and this greatly contributes to life enhancement of a manufacturing component. Furthermore, when the titanium alloy target material of the present invention is used, two kinds of target materials made of Ti and Mo need not be prepared, and a titanium alloy coating film having the above-described properties can be easily produced by using only one kind of a target material. In this case, when the titanium alloy target material is produced by melting, the purity of the target material can be set at a higher level.

MODE FOR CARRYING OUT THE INVENTION

The reasons for limiting each chemical component of the titanium coating film of the present invention and the target material used for forming the coating film are described below.

(Target Material)

(1) $Ti_{1-a}Mo_a$

Figure 1:
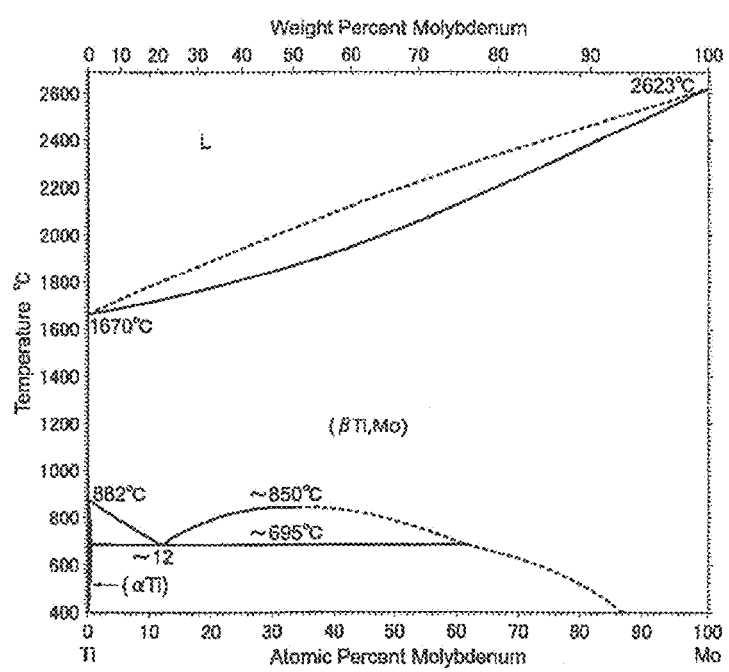
FIG. 1 is a Ti—Mo binary equilibrium state diagram.

As illustrated in FIG. 1, the Ti—Mo binary equilibrium state diagram shows a β all-proportional solid solution pattern in the temperature region of 900 to 1,600° C. and shows, at a segregation temperature of about 850° C. or less, a segregation pattern where the β phase is separated into two phases (β-Ti, β-(MoTi)). At about 700° C. or less, an α phase (α-Ti) precipitates from one (β-Ti) of two phases. On the assumption of an equilibrium state, theoretically, a eutectoid structure based on α-Ti and β-(MoTi) is considered to emerge in the region satisfying $0.04 \leq a \leq 0.10$, where Mo and Ti are in the state of being completely dissolved into solid solution. In this case, a metastable intermediate phase called ω phase (ω-Ti) is sometimes produced in the intermediate stage of changing from β phase to α phase.

(Coating Film)

(2) $(Ti_{1-a}Mo_a)_{1-x}N_x$

Each of a and x represents an atom ratio, the titanium alloy coating film as a whole satisfies $0.04 \leq a \leq 0.32$ and $0.40 \leq x \leq 0.60$, and when a target material corresponding to the alloy composition within the region satisfying $0.04 \leq a \leq 0.32$ is used and at the same time, $0.40 \leq x \leq 0.60$ is satisfied, a titanium alloy coating film having sufficient film hardness and adhesiveness as demonstrated in the later-described test results can be obtained. The atom ratio is preferably $0.04 \leq a \leq 0.10$, more preferably $0.04 \leq a \leq 0.08$.

In addition, the film hardness of the titanium alloy coating film represented by $(Ti_{1-a}Mo_a)_{1-x}N_x$ satisfies at least a condition of 3,000 HV or more, and when the film hardness satisfies at least a condition of 3,000 HV or more, the film life, for example, in cold forging can be enhanced.

(3) $(Ti_{1-a}Mo_a)_{1-y}C_y$

Each of a and y represents an atom ratio, the titanium alloy coating film as a whole satisfies $0.04 \leq a \leq 0.32$ and satisfies $0.40 \leq y \leq 0.60$, and when a target material corresponding to the alloy composition within the region satisfying $0.04 \leq a \leq 0.32$ is used and at the same time, $0.40 \leq y \leq 0.60$ is satisfied, a titanium alloy coating film having sufficient film hardness and adhesiveness as demonstrated in the later-described test results can be obtained. The atom ratio is preferably $0.04 \leq a \leq 0.10$, more preferably $0.04 \leq a \leq 0.08$.

In addition, the film hardness of the titanium alloy coating film represented by $(Ti_{1-a}Mo_a)_{1-y}C_y$ satisfies at least a condition of 3,000 HV or more, and when the film hardness satisfies at least a condition of 3,000 HV or more, the film life, for example, in cold forging can be more successfully enhanced.

(4) $(Ti_{1-a}Mo_a)_{1-x-y}C_yN_x$

Each of a and y represents an atom ratio, the titanium alloy coating film as a whole satisfies $0.04 \le a \le 0.32$ and satisfies $0.20 \le x, y \le 0.40$ and $0.40 \le 1-x-y \le 0.60$, and when a target material corresponding to the alloy composition within the region satisfying $0.04 \le a \le 0.32$ is used and at the same time, $0.20 \le x, y \le 0.40$ and $0.40 \le 1-x-y \le 0.60$ are satisfied, a titanium alloy coating film having sufficient film hardness and adhesiveness as demonstrated in the later-described test results can be obtained. The atom ratio is preferably $0.04 \le a \le 0.10$, more preferably $0.04 \le a \le 0.08$.

In addition, the film hardness of the titanium alloy coating film represented by $(Ti_{1-a}Mo_a)_{1-x-y}C_yN_x$ satisfies at least a condition of 3,000 HV or more, and when the film hardness satisfies at least a condition of 3,000 HV or more, similarly to the case of $(Ti_{1-a}Mo_a)_{1-x}N_x$, the film life, for example, in cold forging can be enhanced.

EXAMPLES

In the following, Examples of the present invention are described.
(Composition (at %) of Target Material)

In Examples (1 to 24: see, Table 1), a titanium alloy working out to a target material was manufactured by two methods of smelting and powder sintering. Specifically, respective target materials of, in terms of atom ratio, $Ti_{0.96}Mo_{0.04}$ (hereinafter, referred to as Ti-4Mo (smelting) when produced by smelting, and as Ti-4Mo (powder sintering) when produced by powder sintering), $Ti_{0.92}Mo_{0.08}$ (hereinafter, referred to as Ti-8Mo (smelting) when produced by smelting, and as Ti-8Mo (powder sintering) when produced by powder sintering), $Ti_{0.84}Mo_{0.16}$ (hereinafter, referred to as Ti-16Mo (smelting) when produced by smelting, and as Ti-16Mo (powder sintering) when produced by powder sintering), and $Ti_{0.68}Mo_{0.32}$ (hereinafter, referred to as Ti-32Mo (smelting) when produced by smelting, and as Ti-32Mo (powder sintering) when produced by powder sintering) were manufactured.

On the other hand, in Comparative Examples (1 to 8), a titanium alloy working out to a target material was also manufactured by two methods of smelting and powder sintering. Specifically, respective target materials of, in terms of atom ratio, $Ti_{1.00}$ (hereinafter, referred to as Ti (smelting) when produced by smelting, and as Ti (powder sintering) when produced by powder sintering), $Ti_{0.50}Al_{0.50}$ (hereinafter, referred to as Ti-50Al (smelting) when produced by smelting, and as Ti-50Al (powder sintering) when produced by powder sintering), $Cr_{1.00}$ (hereinafter, referred to as Cr (smelting) when produced by smelting, and as Cr (powder sintering) when produced by powder sintering), and $Al_{0.50}Cr_{0.50}$ (hereinafter, referred to as Al-50Cr (smelting) when produced by smelting, and as Al-50Cr (powder sintering) when produced by powder sintering) were manufactured.
(Melting Method of Target Material)

In order to melt a titanium alloy, etc. working out to the target material, the top part of a titanium alloy material, etc. was melted by a water-cooled crucible induction melting furnace, with the bottom part of the material put into contact with the inner bottom part of the water-cooled copper crucible being kept in the solidified state, and the molten metal was alloyed while reducing the contact area with the inner wall surface of the crucible under an electromagnetic force generated by an induction coil. According to this melting method, contamination due to contact with the crucible can be reduced and at the same time, an ingot in which respective components constituting the titanium alloy, etc. are uniformly dissolved into solid solution can be obtained.

Specifically, the material was melted in an inert gas atmosphere by using a water-cooled crucible induction melting furnace. First, Ti was melted and after melting, Mo was added to manufacture about 2 tons of alloy ingot. Incidentally, the melting method is not limited to the water-cooled crucible induction meting method and, for example, a plasma melting method using a plasma melting furnace, or an EB melting method using an electron beam, may be employed.

The manufactured ingot was subjected to hot forging and rolling, forming into a predetermined shape (for example, a round bar or a plate material), heat treatment, and then machining to form a disc-shaped target.
(Production Method of Coating Film)

With respect to respective targets for Examples above, each of the coating films of (Ti-4Mo)N (smelting: Example 1), (Ti-8Mo)N (smelting: Example 2), (Ti-16Mo)N (smelting: Example 3), (Ti-32Mo)N (smelting: Example 4) (these nitrides are referred to as TiMoN (smelting)), (Ti-4Mo)C (smelting: Example 5), (Ti-8Mo)C (smelting: Example 6), (Ti-16Mo)C (smelting: Example 7), (Ti-32Mo)C (smelting: Example 8) (these carbides are collectively referred to as TiMoC (smelting)), (Ti-4Mo)CN (smelting: Example 9), (Ti-8Mo)CN (smelting: Example 10), (Ti-16Mo)CN (smelting: Example 11), (Ti-32Mo)CN (smelting: Example 12) (these carbonitrides are collectively referred to as TiMoCN (smelting)), (Ti-4Mo)N (powder sintering: Example 13), (Ti-8Mo)N (powder sintering: Example 14), (Ti-16Mo)N (powder sintering: Example 15), (Ti-32Mo)N (powder sintering: Example 16) (these nitrides are collectively referred to as TiMoN (powder sintering)), (Ti-4Mo)C (powder sintering: Example 17), (Ti-8Mo)C (powder sintering: Example 18), (Ti-16Mo)C (powder sintering: Example 19), (Ti-32Mo)C (powder sintering: Example 20) (these carbides are collectively referred to as TiMoC (powder sintering)), (Ti-4Mo)CN (powder sintering: Example 21), (Ti-8Mo)CN (powder sintering: Example 22), (Ti-16Mo)CN (powder sintering: Example 23), and (Ti-32Mo)CN (powder sintering: Example 24) (these carbonitrides are collectively referred to as TiMoCN (powder sintering)) was formed on a surface of each test piece TP (made of SKH51, 12 mm×12 mm×5 mm, 64 HRC) by AIP (arc ion plating method).

On the other hand, with respect to respective targets for Comparative Examples above, each of the coating films of TiN (smelting: Comparative Example 1), (Ti-50Al)N (smelting: Comparative Example 2; hereinafter, simply referred to as TiAlN (smelting)), CrN (smelting: Comparative Example 3), (Al-50Cr)N (smelting: Comparative Example 4; hereinafter, simply referred to as AlCrN (smelting)), TiN (powder sintering: Comparative Example 5), (Ti-50Al)N (powder sintering: Comparative Example 6; hereinafter, simply referred to as TiAlN (powder sintering)), CrN (powder sintering: Comparative Example 7), and (Al-50Cr)N (powder sintering: Comparative Example 8; hereinafter, simply referred to as AlCrN (powder sintering)) was formed (all a single layer) on a surface of each test piece TP (made of SKH51, 12 mm×12 mm×5 mm, 64 HRC) by AIP (arc ion plating method). Here, the production conditions (coating time, arc current value, bias voltage value, etc.) were appropriately set so that a film thickness of about 2 μm can be obtained.

(Evaluation Method)

(1) Cross-Sectional Observation

Figure 5:
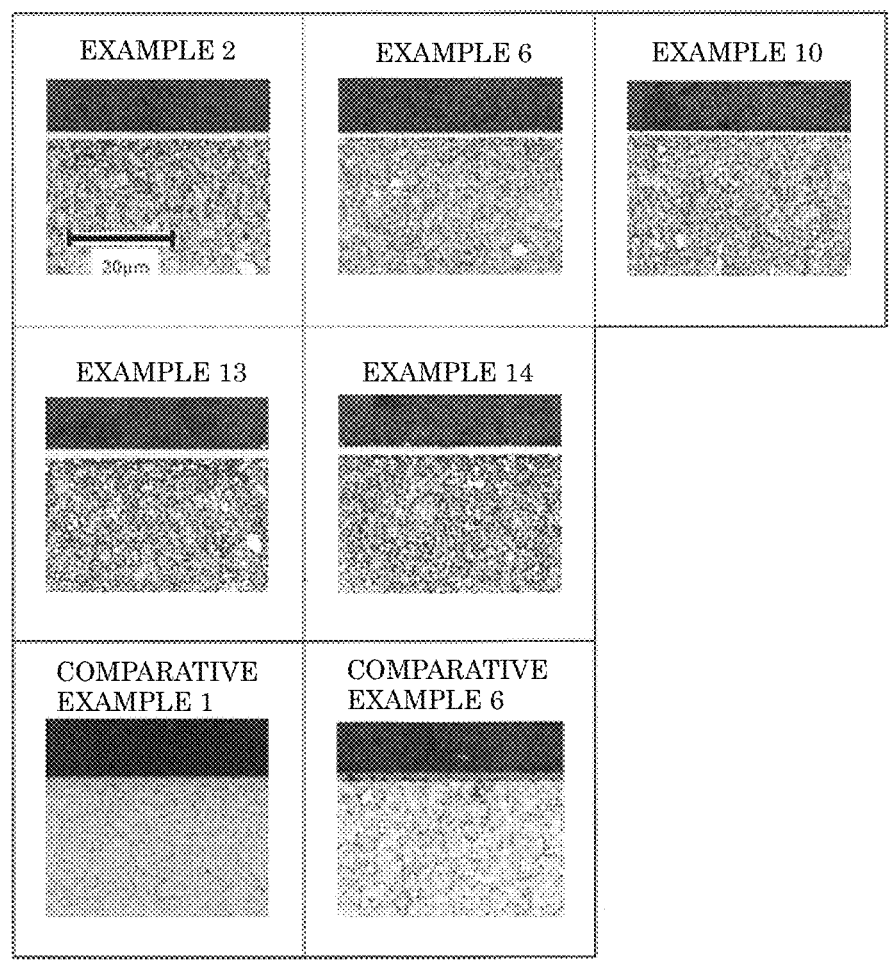
FIG. 5 shows cross-sectional photographs by the type of film.

Cross-sectional observation (at a magnification of 400 times) was performed. FIG. 5 illustrates a cross-sectional photograph. Incidentally, in FIGS. 5 to 8, Example 2 corresponds to (Ti-8Mo)N (smelting), Example 6 corresponds to (Ti-8Mo)C (smelting), Example 10 corresponds to (Ti-8Mo)CN (smelting), Example 13 corresponds to (Ti-4Mo)N (powder sintering), Example 14 corresponds to (Ti-8Mo)N (powder sintering), Comparative Example 1 corresponds to TiN (smelting), and Comparative Example 6 corresponds to TiAlN (powder sintering).

(2) Film Composition

The content ratio of respective components in the film was determined by Energy Dispersive X-ray Fluorescence (EDXRF) analysis. The measurement results are shown in Table 1. In addition, the composition of each of (Ti-8Mo)N (smelting) (Example 2), (Ti-8Mo)C (smelting) (Example 6), (Ti-8Mo)CN (smelting) (Example 10), (Ti-4Mo)N (powder sintering) (Example 13), (Ti-8Mo)N (powder sintering) (Example 14), TiN (smelting) (Comparative Example 1), and Ti-8Mo (smelting) representative of target material was analyzed by X-ray diffraction profile measurement by a diffractometer method. Specifically, each diffraction peak was measured as follows. Diffraction profile measurement by a diffractometer method was performed using Kα line (wavelength: about 0.179 nm) of Co as an incident X-ray, and diffraction peak intensities appearing at a diffraction angle 2θ ranging from 20 to 120° were detected. The measurement results are shown in FIGS. 9 to 15.

Figure 16A:
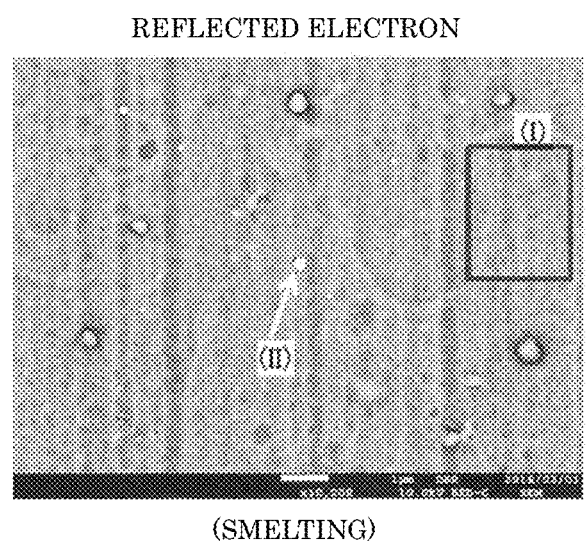
FIG. 16A is a photograph illustrating the reflected electron image of Example 2: (Ti-8Mo)N (smelting).

Furthermore, with respect to Example 2: (Ti-8Mo)N (smelting) and Example 14: (Ti-8Mo)N (powder sintering), an EDX spectrum by characteristic X-ray for Ti, Mo and N components was detected based on a reflected electron image by using an Energy Dispersive X-ray Spectroscopy (EDX) apparatus incorporated into Scanning Electron Microscope (SEM). FIGS. 16A and 17A each illustrates a reflected electron image photograph (10,000 times), FIGS. 16B and 16C each illustrates the detection results of EDX spectrum corresponding to FIG. 16A, and FIGS. 17B and 17C each illustrates the detection results of EDX spectrum corresponding to FIG. 17A.

(3) Surface Roughness

The arithmetic average roughness Ra and the maximum height roughness Rz were measured by a measurement method in conformity with surface roughness standards JIS B 0601-2013. The measurement results of the arithmetic average roughness are shown in Table 1 and FIGS. 2A and 2B, and the measurement results of the maximum height are shown in Table 1 and FIGS. 2C and 2D. In Table 1, "A" is assigned when the arithmetic average roughness was less than 0.5 μm (threshold), "B" is assigned when from 0.5 μm to less than 1.0 μm, "C" is assigned when 1.0 μm or more, and judgment was "pass" when the level of "A" is reached. In addition, "A" is assigned when the maximum height was less than 5.0 μm (threshold), "B" is assigned when from 5.0 μm to less than 7.5 μm, "C" is assigned when 7.5 μm or more, and the judgment was "pass" when the level of "A" is reached.

(4) Indentation Test

Figure 6:
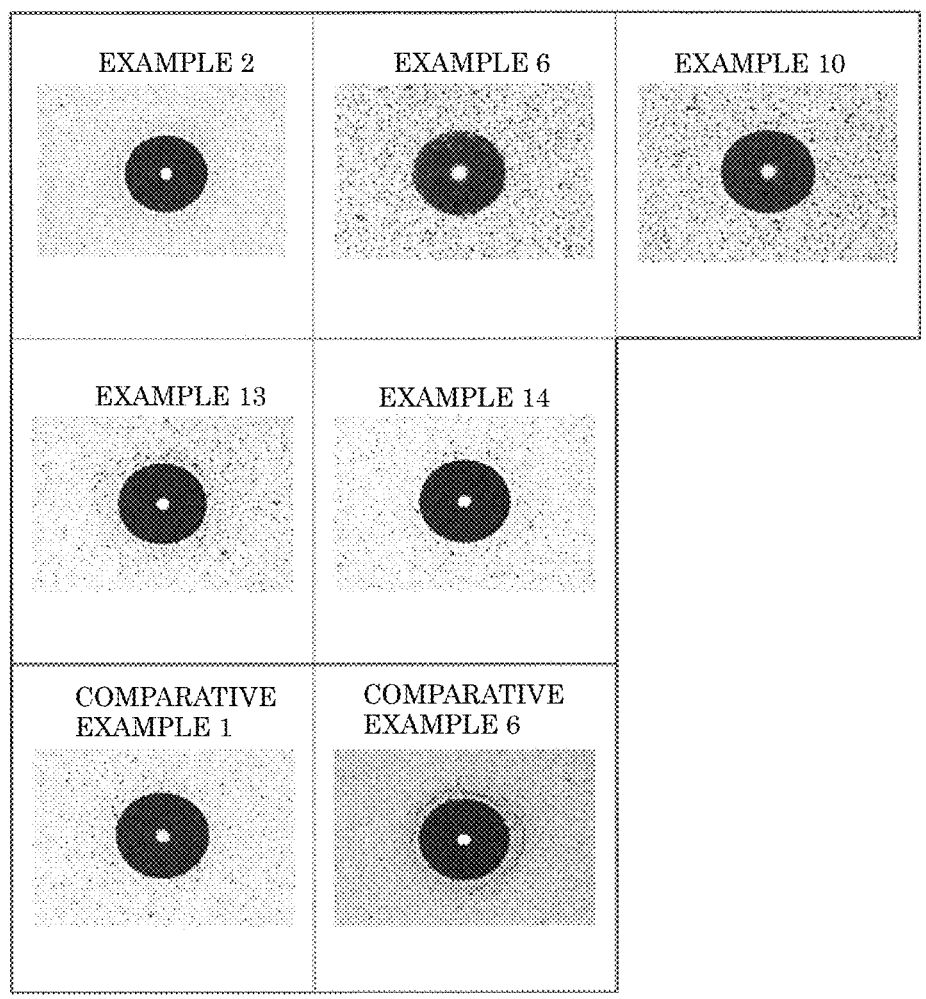
FIG. 6 shows surface photographs by the type of film after an indentation test.

Using a Rockwell tester, whether the adhesiveness is good or bad was judged from the peeling state (presence or absence of cracks) of the coating film around indentation with a Rockwell pressing load of 150 kg. At the time of judgment, the indentation was observed at magnifications of 100 times and 400 times by an optical microscope. FIG. 6 (100 times) and FIG. 7 (400 times) each illustrates the surface structure around indentation, and FIG. 8 (400 times) illustrates the surface structure excluding a neighborhood of indentation.

(5) Scratch Test

In making a scratch by pressing a diamond cone against the coating film, the pressing load (N) was continuously increased to measure the critical load (Lc) at which peeling was initiated. The measurement results are shown in Table 1 and FIGS. 3A and 3B. In Table 1, "A" is assigned when the critical load is 50 N (threshold) or more, "B is assigned when from 40 N to less than 50 N, "C" is assigned when less than 40 N, and judgment was "pass" when the level of "A" is reached.

(6) Film Hardness

Measuring instrument: dynamic ultrafine hardness meter DUH-211 (Shimadzu Corporation)

Indenter: Using a trigonal pyramid indenter (edge-to-edge angle: 115°), the Vickers hardness (HV) was calculated as the film hardness by an indentation hardness test (indentation method) where the hardness is determined from a loading/unloading curve. Incidentally, the hardness was measured by setting the indentation amount during measurement to be about 1/10 of the film thickness so as not to be affected by the substrate. Then, the measured indentation hardness (Hit) was converted to the Vickers hardness according to the following conversion formula:

$$HV = 0.0924 \times Hit$$

Figure 4A:
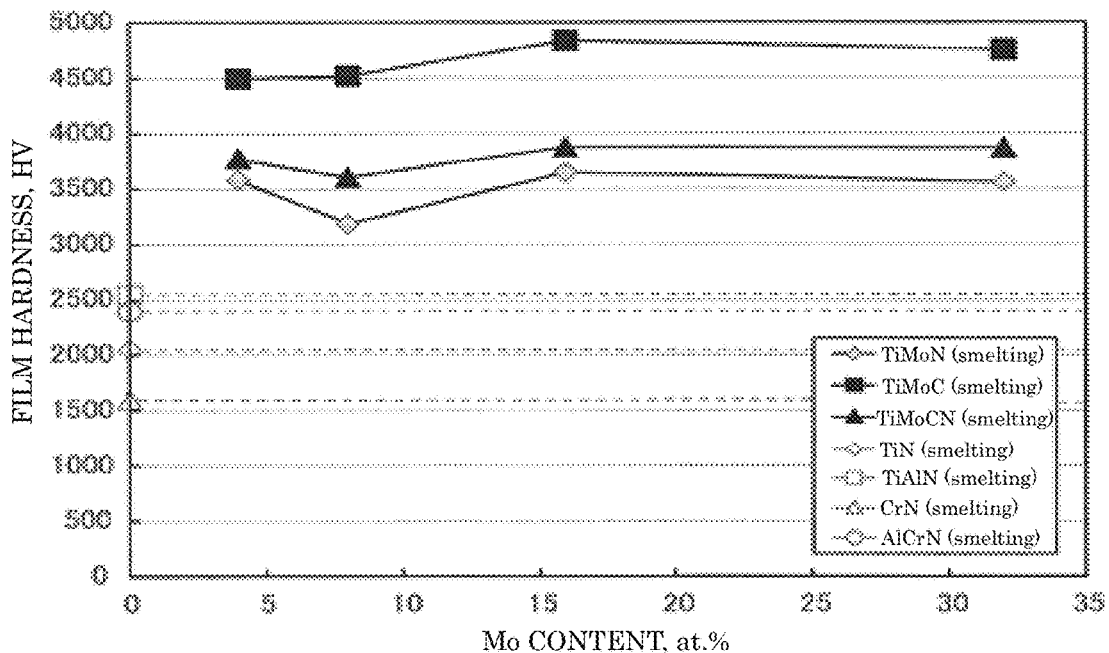
FIG. 4A is a graph illustrating the relationship between the Mo content and the film hardness of each coating film when the target material is produced by smelting.
Figure 4B:
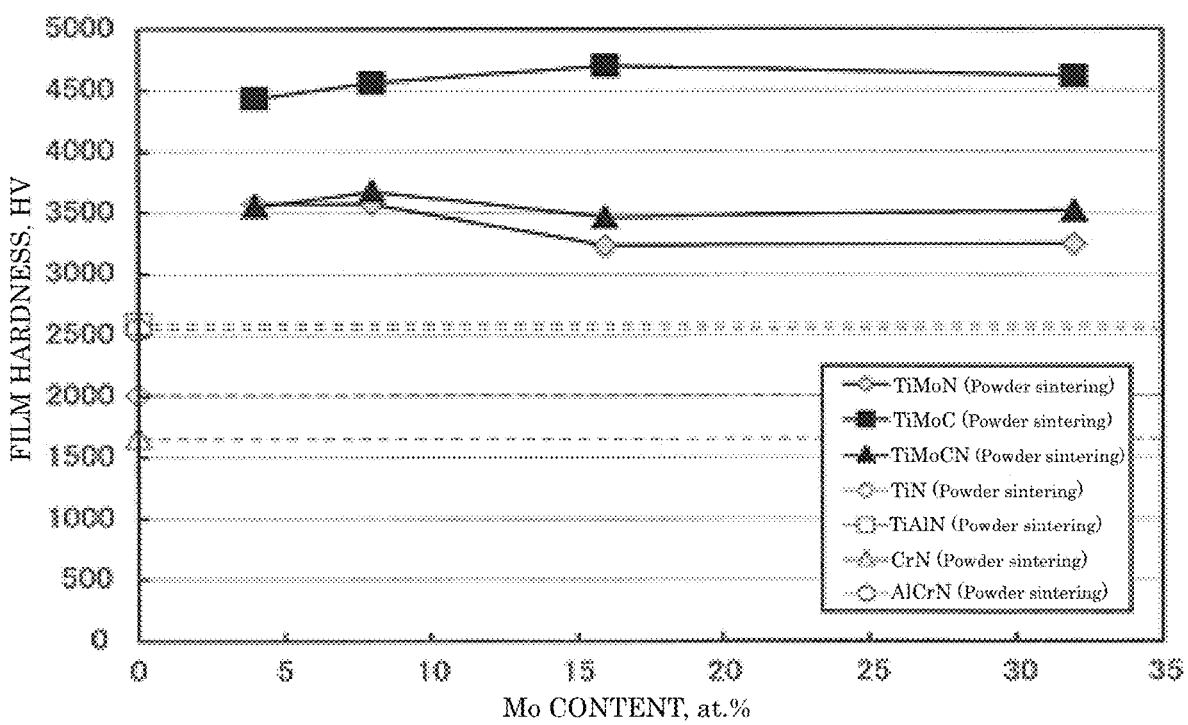
FIG. 4B is a graph illustrating the relationship between the Mo content and the film hardness of each coating film when the target material is produced by powder sintering.

The measurement results are shown in Table 1 and FIGS. 4A and 4B. In Table 1, "AA" is assigned when the film hardness is 4,000 HV or more, "A" is assigned when from 3,000 (threshold) to less than 4,000 HV, "B" is assigned when from 2,000 to less than 3,000 HV, "C" is assigned when less than 2,000 HV, and the judgment was "pass" when the level of "A" is reached.

TABLE 1

Table: Chemical Composition of Metal Film and Various Properties of Sample

| | | Thin Film Composition (at %) | | | | | | Production Method of Target | Film Hardness | | Critical Load | | Surface Roughness | | | |
|---|---|---|---|---|---|---|---|---|---|---|---|---|---|---|---|---|
| | | | | | | | | | | | | | Arithmetic Average Roughness [μm] | | Maximum Height [μm] | |
| | | Ti | Mo | Al | Cr | N | C | | Measured Value [Hv] | Judgment | Measured Value [N] | Judgment | | Judgment | | Judgment |
| Example 1 | (Ti-4Mo)N | 48 | 2 | — | — | 50 | — | smelting | 3582 | A | 65.0 | A | 0.16 | A | 2.38 | A |
| Example 2 | (Ti-8Mo)N | 46 | 4 | — | — | 50 | — | smelting | 3191 | A | 62.8 | A | 0.10 | A | 2.34 | A |
| Example 3 | (Ti-16Mo)N | 42 | 8 | — | — | 50 | — | smelting | 3646 | A | 64.6 | A | 0.12 | A | 2.73 | A |
| Example 4 | (Ti-32Mo)N | 34 | 16 | — | — | 50 | — | smelting | 3560 | A | 64.7 | A | 0.13 | A | 2.82 | A |
| Example 5 | (Ti-4Mo)C | 48 | 2 | — | — | — | 50 | smelting | 4505 | AA | 50.5 | A | 0.30 | A | 2.68 | A |

TABLE 1-continued

Table: Chemical Composition of Metal Film and Various Properties of Sample

| | Thin Film Composition (at %) | | | | | | Production Method of | Film Hardness | | Critical Load | | Surface Roughness Arithmetic Average | | Maximum Height | |
|---|---|---|---|---|---|---|---|---|---|---|---|---|---|---|---|
| | Ti | Mo | Al | Cr | N | C | Target | Measured Value [Hv] | Judgment | Measured Value [N] | Judgment | Roughness [μm] | Judgment | [μm] | Judgment |
| Example 6 | (Ti-8Mo)C | 46 | 4 | — | — | — | 50 smelting | 4525 | AA | 51.9 | A | 0.24 | A | 3.20 | A |
| Example 7 | (Ti-16Mo)C | 42 | 8 | — | — | — | 50 smelting | 4844 | AA | 50.2 | A | 0.19 | A | 3.65 | A |
| Example 8 | (Ti-32Mo)C | 34 | 16 | — | — | — | 60 smelting | 4761 | AA | 52.0 | A | 0.22 | A | 3.77 | A |
| Example 9 | (Ti-4Mo)CN | 48 | 2 | — | — | 25 | 25 smelting | 3777 | A | 57.9 | A | 0.13 | A | 1.88 | A |
| Example 10 | (Ti-8Mo)CN | 46 | 4 | — | — | 25 | 25 smelting | 3601 | A | 53.6 | A | 0.10 | A | 2.98 | A |
| Example 11 | (Ti-16Mo)CN | 42 | 8 | — | — | 25 | 25 smelting | 3885 | A | 55.9 | A | 0.08 | A | 1.89 | A |
| Example 12 | (Ti-32Mo)CN | 34 | 16 | — | — | 25 | 25 smelting | 3873 | A | 53.5 | A | 0.12 | A | 2.27 | A |
| Example 13 | (Ti-4Mo)N | 48 | 2 | — | — | 50 | — powder sintering | 3570 | A | 60.3 | A | 0.22 | A | 3.23 | A |
| Example 14 | (Ti-8Mo)N | 46 | 4 | — | — | 50 | — powder sintering | 3572 | A | 58.1 | A | 0.19 | A | 3.43 | A |
| Example 15 | (Ti-16Mo)N | 42 | 8 | — | — | 50 | — powder sintering | 3236 | A | 60.1 | A | 0.14 | A | 2.47 | A |
| Example 16 | (Ti-32Mo)N | 34 | 16 | — | — | 50 | — powder sintering | 3247 | A | 58.9 | A | 0.13 | A | 2.39 | A |
| Example 17 | (Ti-4Mo)C | 48 | 2 | — | — | — | 50 powder sintering | 4432 | AA | 52.8 | A | 0.23 | A | 3.44 | A |
| Example 18 | (Ti-8Mo)C | 46 | 4 | — | — | — | 50 powder sintering | 4569 | AA | 54.3 | A | 0.20 | A | 2.63 | A |
| Example 19 | (Ti-16Mo)C | 42 | 8 | — | — | — | 50 powder sintering | 4702 | AA | 53.1 | A | 0.22 | A | 3.06 | A |
| Example 20 | (Ti-32Mo)C | 34 | 16 | — | — | — | 50 powder sintering | 4617 | AA | 55.3 | A | 0.22 | A | 3.29 | A |
| Example 21 | (Ti-4Mo)CN | 48 | 2 | — | — | 25 | 25 powder sintering | 3548 | A | 55.9 | A | 0.20 | A | 2.36 | A |
| Example 22 | (Ti-8Mo)CN | 46 | 4 | — | — | 25 | 25 powder sintering | 3675 | A | 56.3 | A | 0.08 | A | 1.81 | A |
| Example 23 | (Ti-16Mo)CN | 42 | 8 | — | — | 25 | 25 powder sintering | 3465 | A | 58.2 | A | 0.17 | A | 2.05 | A |
| Example 24 | (Ti-32Mo)CN | 34 | 16 | — | — | 25 | 25 powder sintering | 3517 | A | 56.7 | A | 0.15 | A | 2.22 | A |
| Comparative Example 1 | TiN | 50 | — | — | — | 50 | — smelting | 2053 | B | 63.6 | A | 0.16 | A | 2.62 | A |
| Comparative Example 2 | (Ti-50Al)N | 25 | — | 25 | — | 50 | — smelting | 2551 | B | 61.4 | A | 0.21 | A | 1.73 | A |
| Comparative Example 3 | CrN | — | — | — | 50 | 50 | — smelting | 1614 | C | 86.0 | A | 0.12 | A | 2.13 | A |
| Comparative Example 4 | (Al-50Cr)N | — | — | 25 | 25 | 50 | — smelting | 2402 | B | 61.2 | A | 0.24 | A | 2.43 | A |
| Comparative Example 5 | TiN | 50 | — | — | — | 50 | — powder sintering | 2010 | B | 62.3 | A | 0.21 | A | 1.69 | A |
| Comparative Example 6 | (Ti-50Al)N | 25 | — | 25 | — | 50 | — powder sintering | 2606 | B | 64.3 | A | 0.24 | A | 2.72 | A |
| Comparative Example 7 | CrN | — | — | — | 50 | 50 | — powder sintering | 1675 | C | 82.0 | A | 0.17 | A | 2.11 | A |
| Comparative Example 8 | (Al-50Cr)N | — | — | 25 | 25 | 50 | — powder sintering | 2549 | B | 60.5 | A | 0.32 | A | 3.07 | A |

(Evaluation Results)

(1) Cross-Sectional Photograph

The cross-sectional structure illustrated in FIG. 5 shows a tendency that the film deposition rate of nitride decreases in order of (Ti-4Mo)N (powder sintering) (Example 13), (Ti-8Mo)N (smelting or powder sintering) (Example 2, Example 14) and TiAlN (Comparative Example 6) (when the coating conditions are the same, the film thickness is reduced in the order above). It is understood that (Ti-8Mo)N (smelting) (Example 2) is not so reduced in the film deposition rate, compared with TiN (smelting) (Comparative Example 1), and therefore makes a higher contribution to productivity than TiAlN. On the other hand, the film deposition rate of Ti-8Mo (smelting) is the same among (Ti-8Mo)N (Example 2), (Ti-8Mo)C (Example 6) and (Ti-8Mo)CN (Example 10). Here, in all cases, peeling in outer appearance was not observed.

(2) Film Composition

The observation results of the composition shown in Table 1 reveal that components substantially at the same atomic ratio as the composition ratio of the target material were detected in all of Examples 1 to 24 and Comparative Examples 1 to 8. Furthermore, as illustrated in FIGS. 9 to 15, a diffraction peak intensity attributed to a single metal phase of Mo was undetected not only from all of the films of (Ti-8Mo)N (smelting and powder sintering), (Ti-8Mo)C (smelting), (Ti-8Mo)CN (smelting) and (Ti-4Mo)N (powder sintering) but also from the target material including Ti-8Mo (smelting). Here, in FIGS. 9 to 13, the diffraction peak intensity position of TiN detected is shifted a slight amount to the high angle side relative to the diffraction peak intensity position inherent in TiN. This is presumed to occur because the size of the lattice constant a differs between Ti and Mo (lattice constant a of Ti>lattice constant a of Mo) and part of (TiN) is substituted by Mo (TiN-MoN).

Figure 16B:
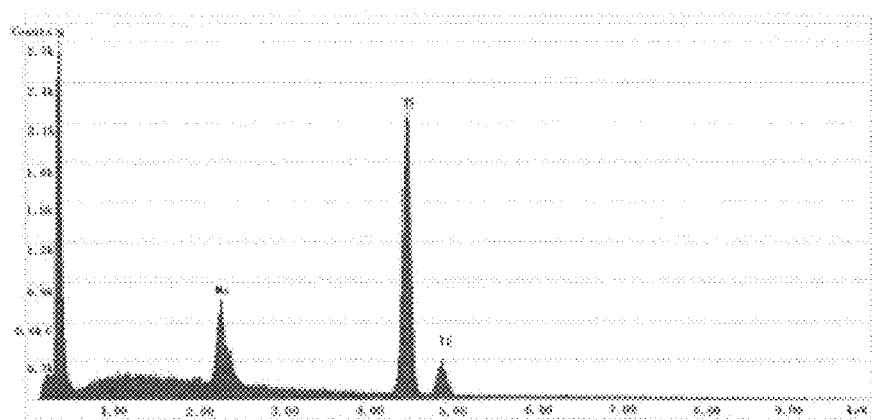
FIG. 16B is a graph illustrating the EDX spectrum corresponding to the region (I) of FIG. 16A.
Figure 16C:
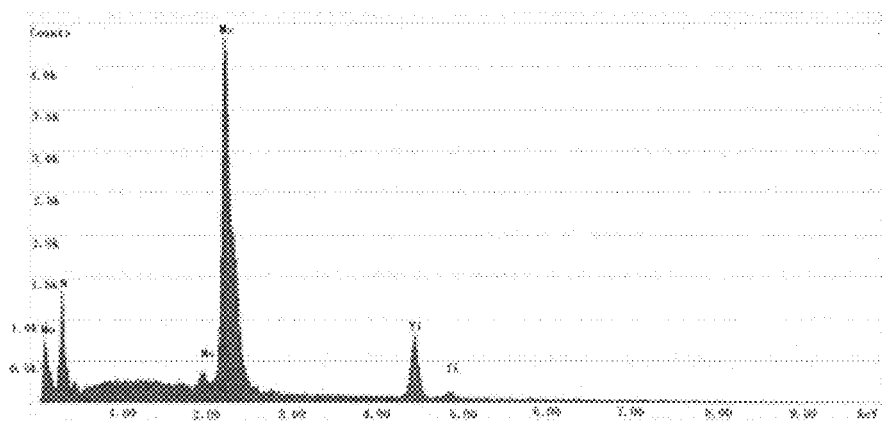
FIG. 16C is a graph illustrating the EDX spectrum corresponding to the region (II) of FIG. 16A.
Figure 17A:
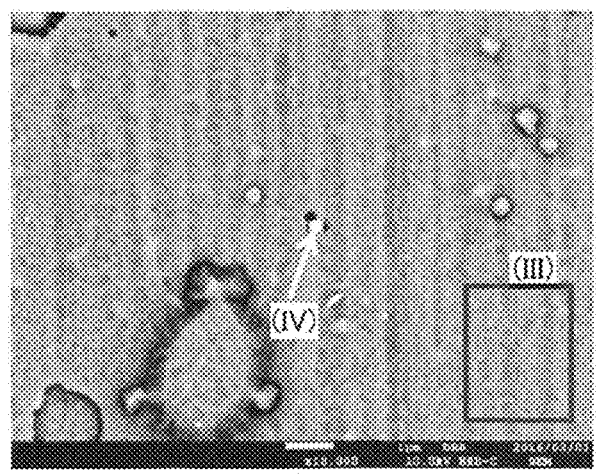
FIG. 17A is a photograph illustrating the reflected electron image of Example 14: (Ti-8Mo)N (powder sintering).
Figure 17B:
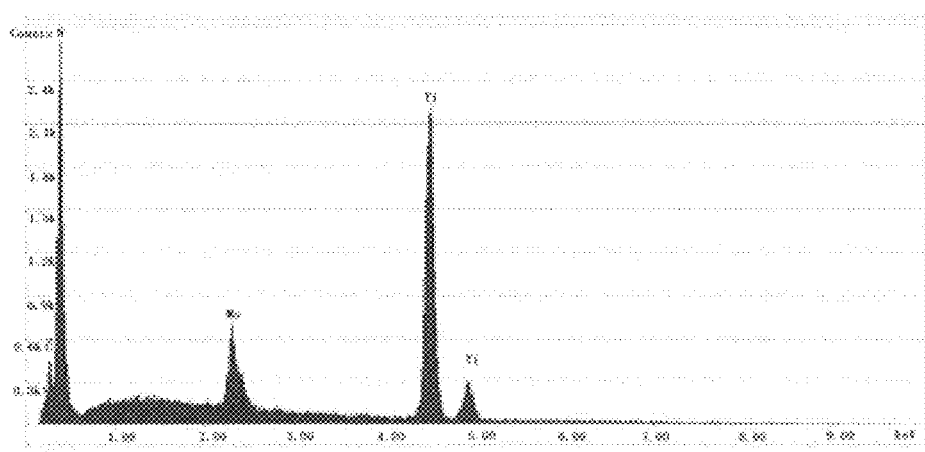
FIG. 17B is a graph illustrating the EDX spectrum corresponding to the region (III) of FIG. 17A.
Figure 17C:
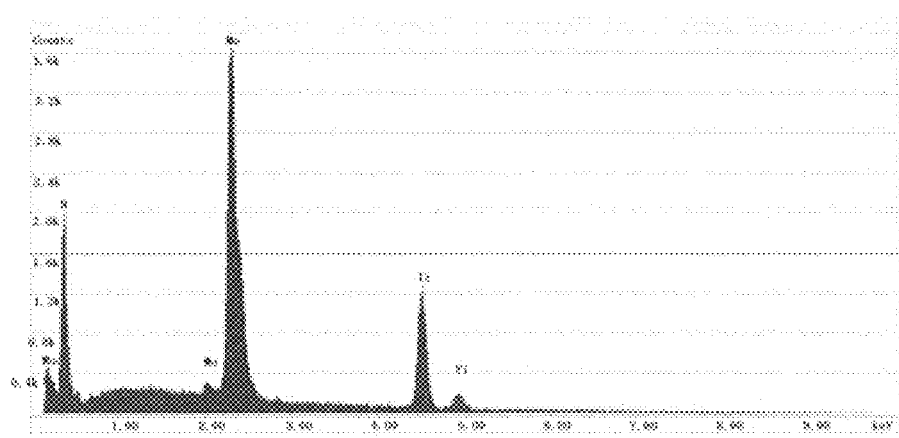
FIG. 17C is a graph illustrating the EDX spectrum corresponding to the region (IV) of FIG. 17A.

In addition, the detection results of each EDX spectrum of FIGS. 16B and 16C corresponding to regions (I) and (II), respectively, in the reflected electron image of FIG. 16A and the detection results of each EDX spectrum of FIGS. 17B and 17C corresponding to regions (III) and (IV), respectively, in the reflected electron image of FIG. 17A revealed that respective components are dissolved into a solid solution in the matrix layer of both Example 2: (Ti-8Mo)N (smelting) and Example 14:(Ti-8Mo)N (powder sintering). Here, as illustrated in FIG. 16C or FIG. 17C, it was confirmed that in some fine regions, an Mo-enriched layer is present as a film deposition defect during vapor deposition. However, in this Example, in consideration of the fact that this type of defect is, for example, difficult to avoid in producing a vapor deposition film by AIP method, is apparently a different layer from the matrix layer put in a solid solution state illustrated in FIG. 16B or FIG. 17B, and is present as dots in a very fine region, the defect above is treated the same as an unavoidable impurity.

(3) Surface Roughness

Figure 2A:
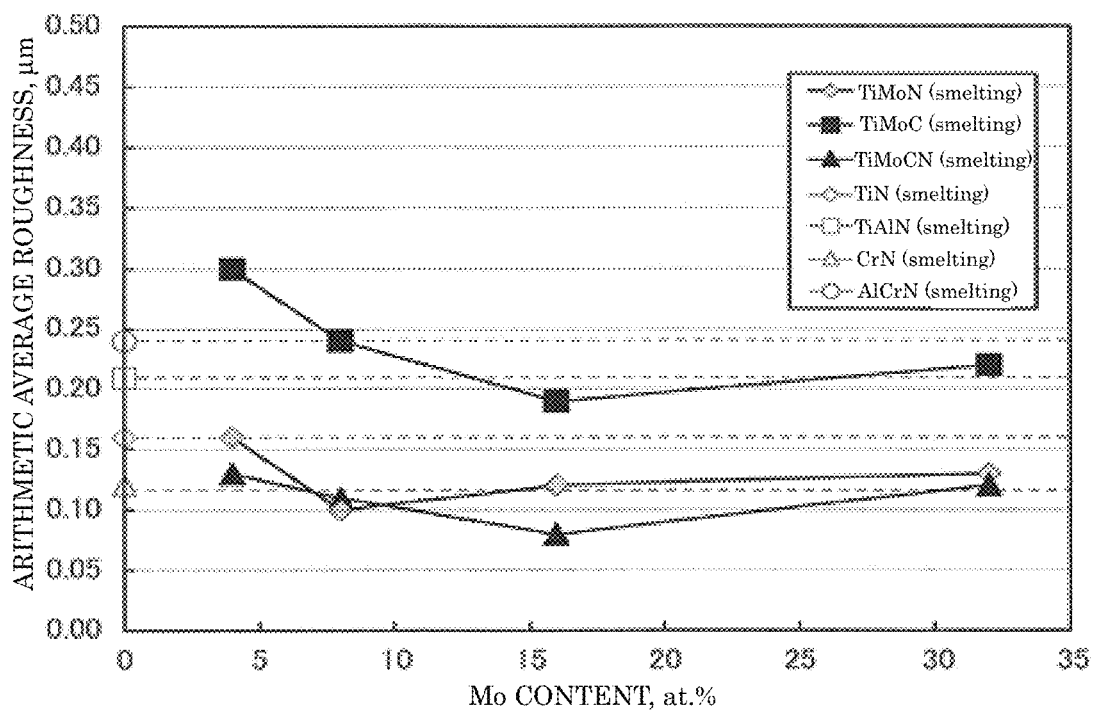
FIG. 2A is a graph illustrating the relationship between the Mo content and the arithmetic average roughness of each coating film when the target material is produced by smelting.
Figure 2B:
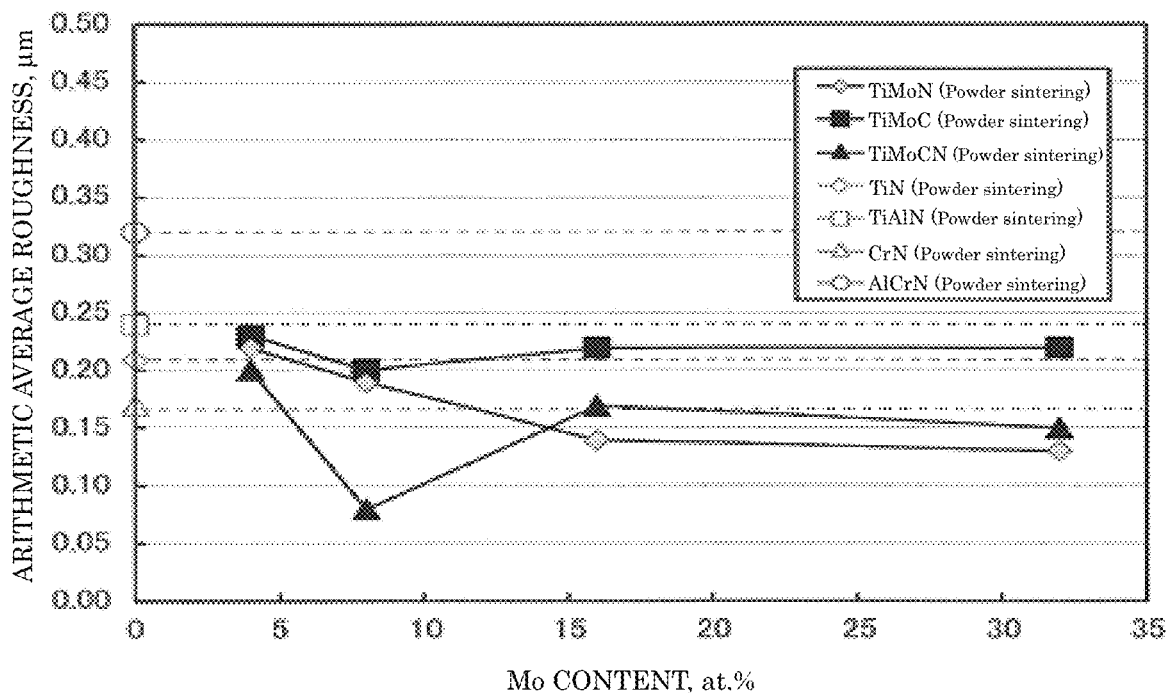
FIG. 2B is a graph illustrating the relationship between the Mo content and the arithmetic average roughness of each coating film when the target material is produced by powder sintering.
Figure 2C:
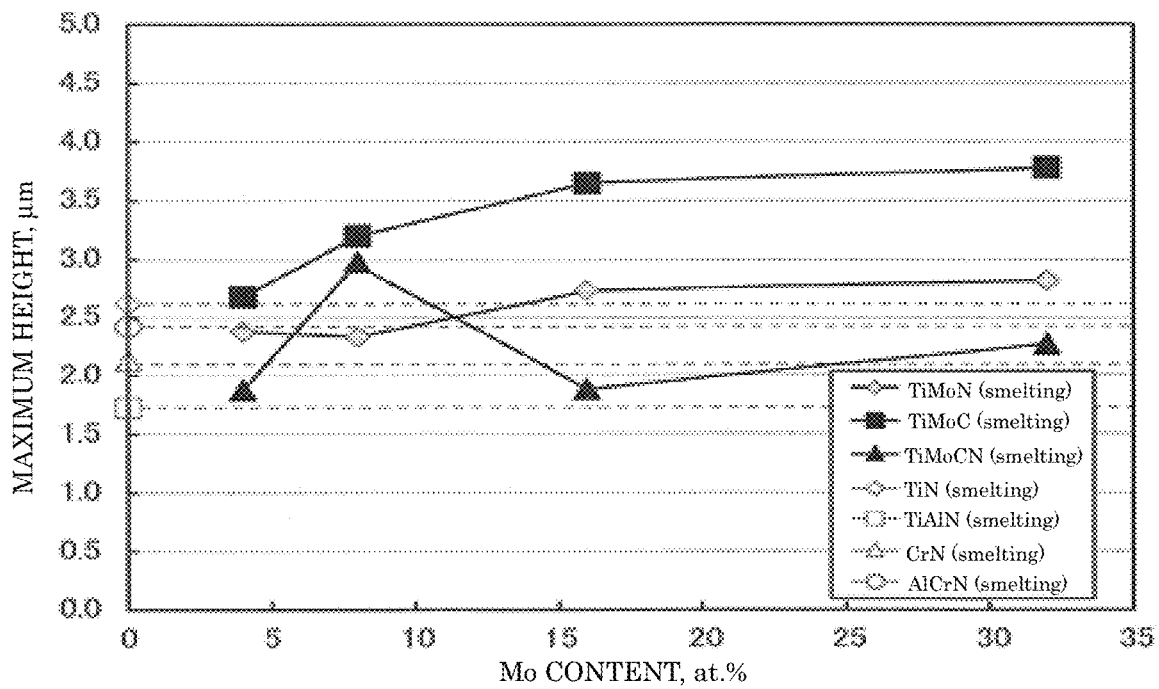
FIG. 2C is a graph illustrating the relationship between the Mo content and the maximum height of each coating film when the target material is produced by smelting.
Figure 2D:
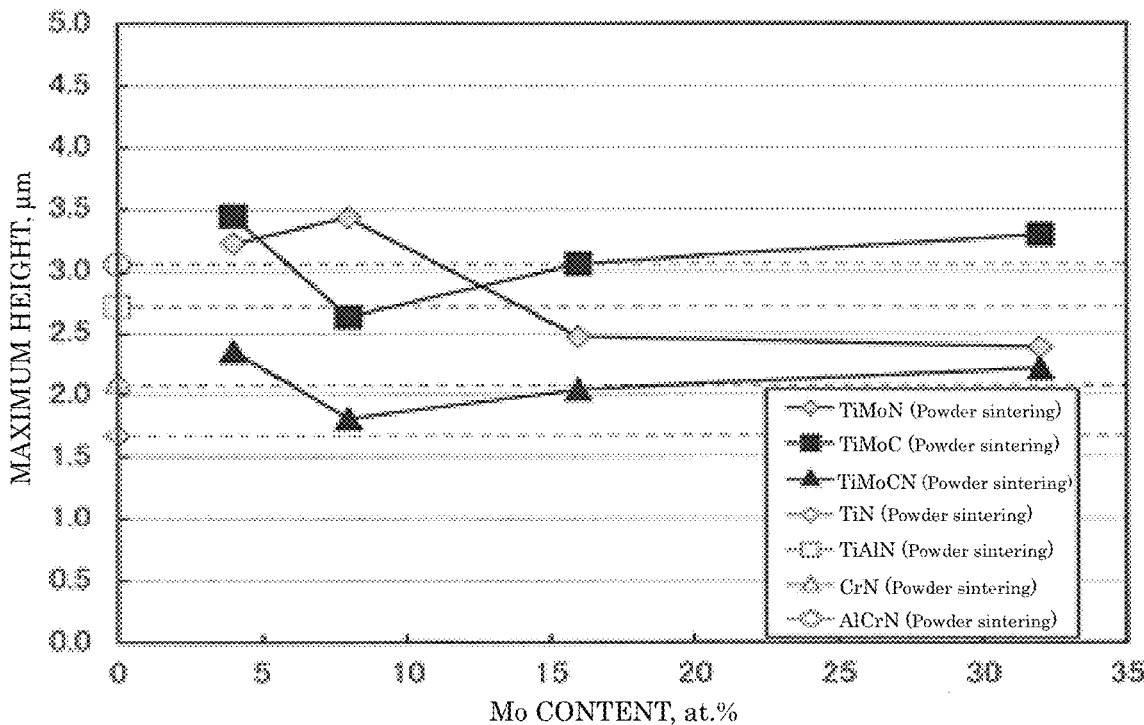
FIG. 2D is a graph illustrating the relationship between the Mo content and the maximum height of each coating film when the target material is produced by powder sintering.

As seen from the measurement results of each surface roughness shown in Table 1 and FIGS. 2A and 2C, with respect to the surface roughness of TiMoN (smelting), TiMoC (smelting) and TiMoCN (smelting), the arithmetic average roughness is substantially the same, the maximum height is also substantially the same, and when the films are viewed individually, each surface roughness changes in a substantially even manner within the Mo content range of 4 to 32. Furthermore, as seen from the measurement results of each surface roughness shown in Table 1 and FIGS. 2B and 2D, with respect to the surface roughness of TiMoN (powder sintering), TiMoC (powder sintering) and TiMoCN (powder sintering), the arithmetic average roughness is substantially the same, the maximum height is also substantially the same, similarly to the case of smelting, and when the films are viewed individually, each surface roughness changes in a substantially even manner within the Mo content range of 4 to 32 as with the case of smelting.

(4) Scratch Test

Figure 3A:
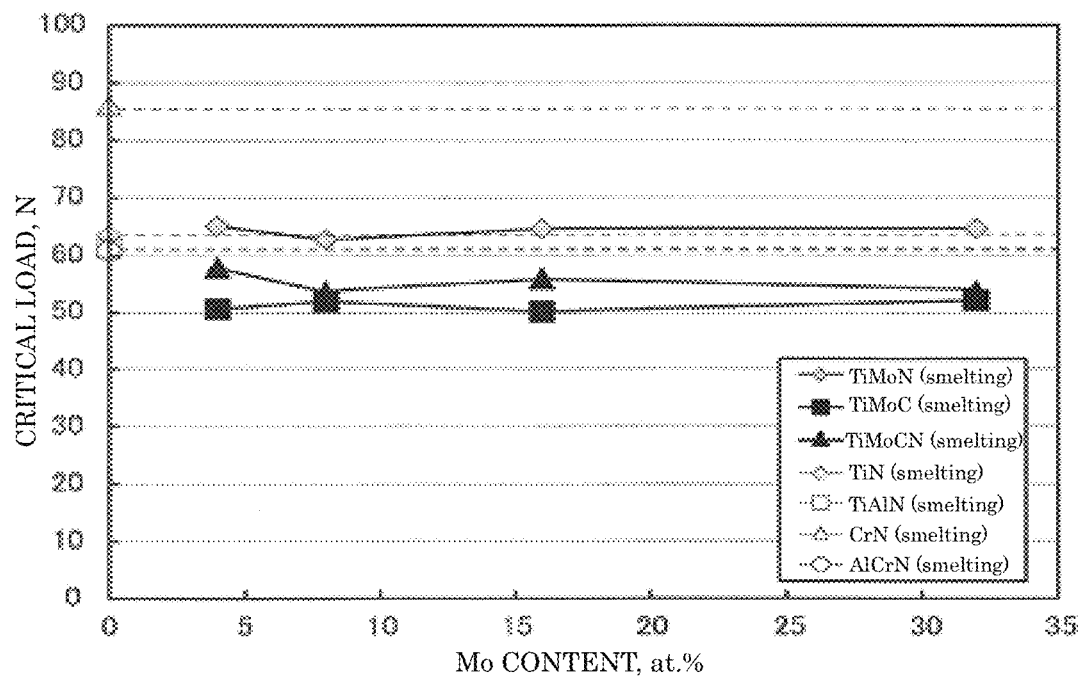
FIG. 3A is a graph illustrating the relationship between the Mo content and the film adhesiveness of each coating film when the target material is produced by smelting.
Figure 3B:
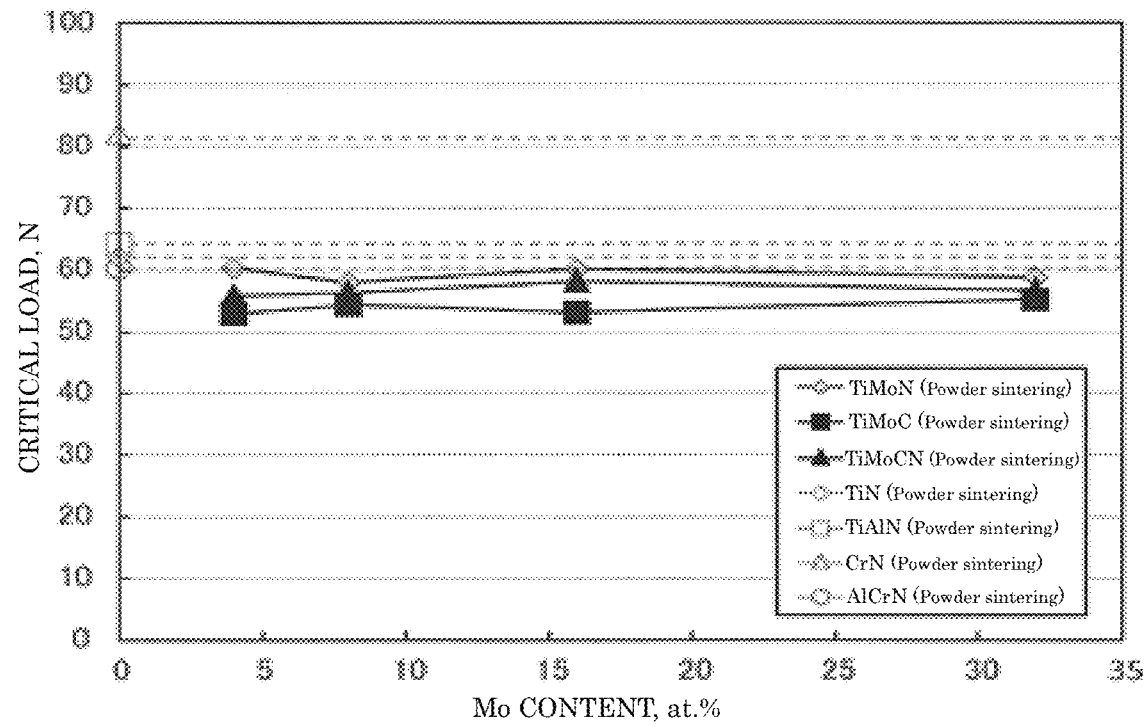
FIG. 3B is a graph illustrating the relationship between the Mo content and the film adhesiveness of each coating film when the target material is produced by powder sintering.

The measurement results of the critical load shown in Table 1 and FIG. 3A revealed that the critical load (film adhesiveness) is 50 N or more in all of TiMoN (smelting), TiMoC (smelting) and TiMoCN (smelting) and substantially the same among these films. When the films are viewed individually, it was confirmed that each critical load changes in a substantially even manner within the Mo content range of 4 to 32. Furthermore, as seen from the measurement results of the critical load shown in Table 1 and FIG. 3B, the critical loads of TiMoN (powder sintering), TiMoC (powder sintering) and TiMoCN (powder sintering) are, similarly to the case of smelting, 50 N or more and substantially the same, and when the films are viewed individually, each critical load changes in a substantially even manner within the Mo content range of 4 to 32 as with the case of smelting.

(5) Film Hardness

The measurement results of the film hardness shown in Table 1 and FIG. 4A revealed that in all of TiMoN (smelting), TiMoC (smelting) and TiMoCN (smelting), the film hardness is larger than the film hardness of TiN (smelting) TiAlN (smelting), CrN (smelting) and AlCrN (smelting). Furthermore, it was confirmed that the film hardnesses of TiMoN (smelting) and TiMoCN (smelting) are 3,000 HV or more and substantially the same but, on the other hand, the film hardness of TiMoC (smelting) is 4,000 HV or more. When the films are viewed individually, it was confirmed that each film hardness changes in a substantially even manner within the Mo content range of 4 to 32. In addition, the measurement results of the film hardness shown in Table 1 and FIG. 4B revealed that in all of TiMoN (powder sintering), TiMoC (powder sintering) and TiMoCN (powder sintering), the film hardness is, similarly to the case of smelting, larger than the film hardness of TiN (powder sintering) TiAlN (powder sintering), CrN (powder sintering) and AlCrN (powder sintering); the film hardnesses of TiMoN (powder sintering) and TiMoCN (powder sintering) are 3,000 HV or more and substantially the same, whereas the film hardness of TiMoC (powder sintering) is 4,000 HV or more; and when the films are viewed individually, each film hardness changes in a substantially even manner within the Mo content range of 4 to 32 as with the case of smelting.

(6) Indentation Test

Figure 7:
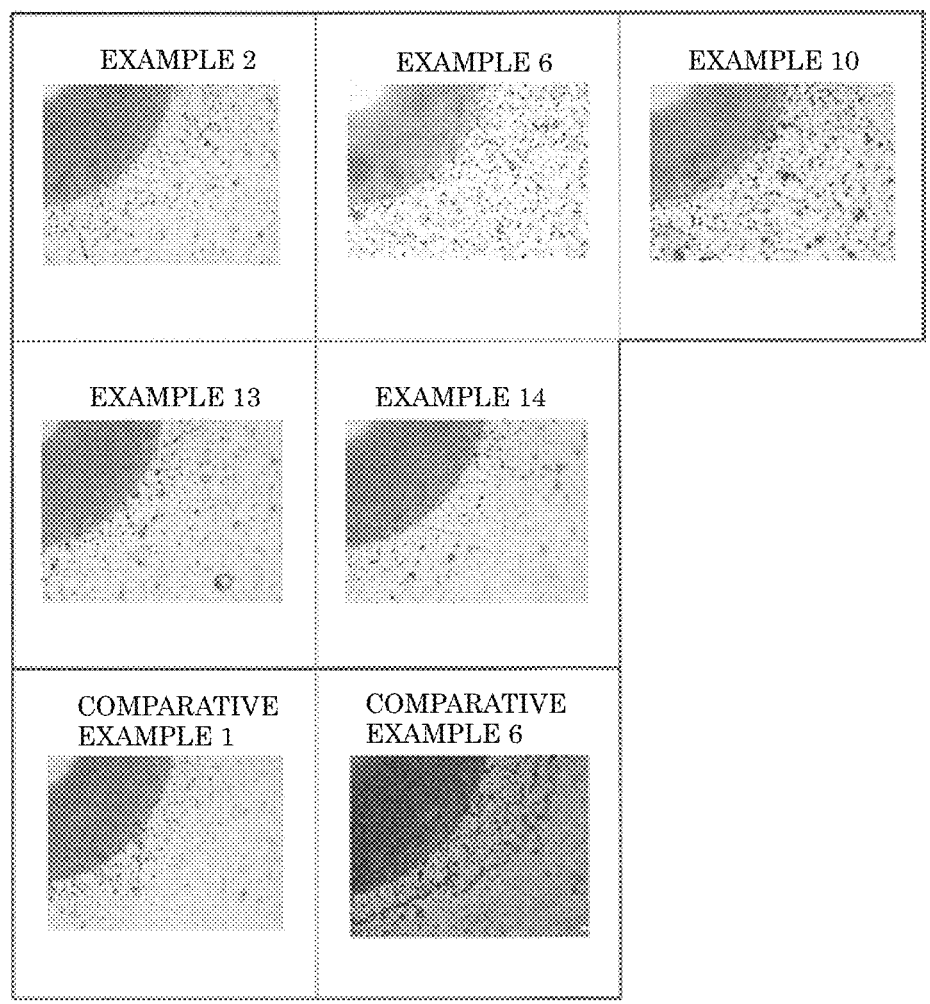
FIG. 7 shows enlarged photographs by the type of film corresponding to FIG. 6.

As seen from the surface structures illustrated in FIGS. 6 and 7, annular cracks were observed in TiAlN (Comparative Example 6), but annular cracks were not observed in all of (Ti-8Mo)N (Example 2), (Ti-8Mo)C (Example 6), (Ti-8Mo)CN (Example 10), which were produced by smelting, (Ti-4Mo)N (Example 13), and (Ti-8Mo)N (Example 14), which were produced by powder sintering.

(7) Surface Observation

Figure 8:
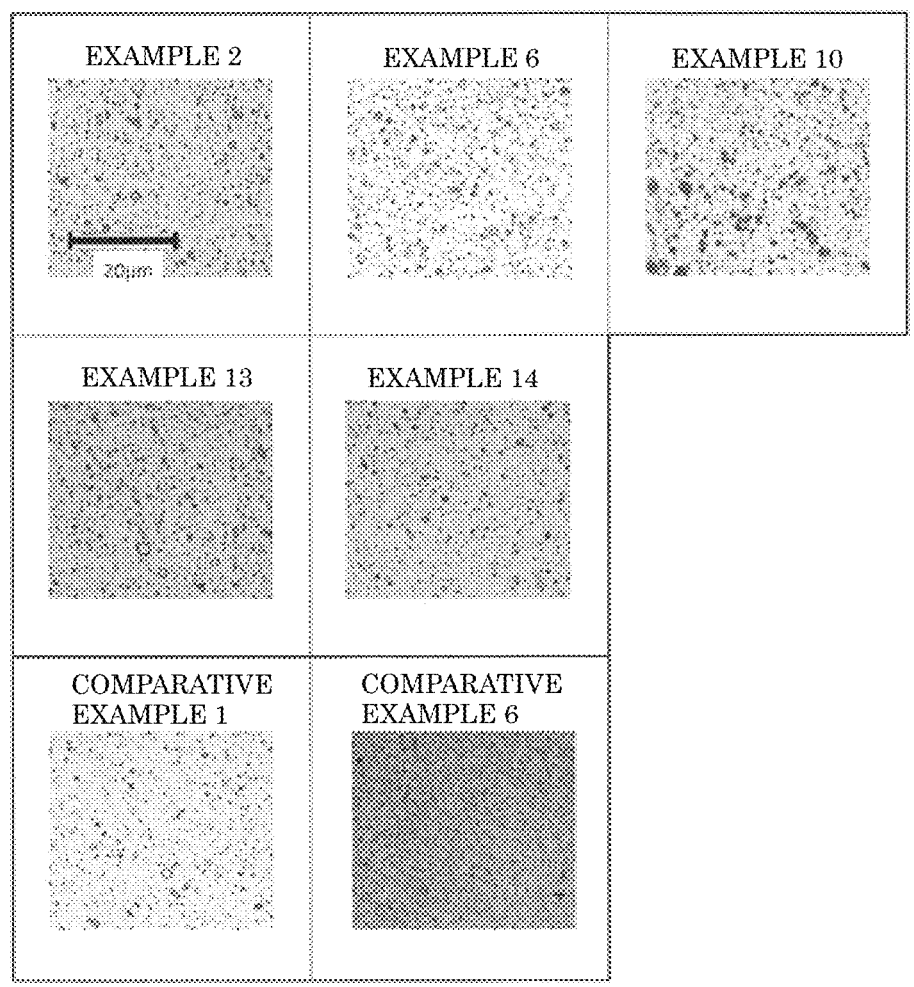
FIG. 8 shows surface structure photographs by the type of film.
Figure 9:
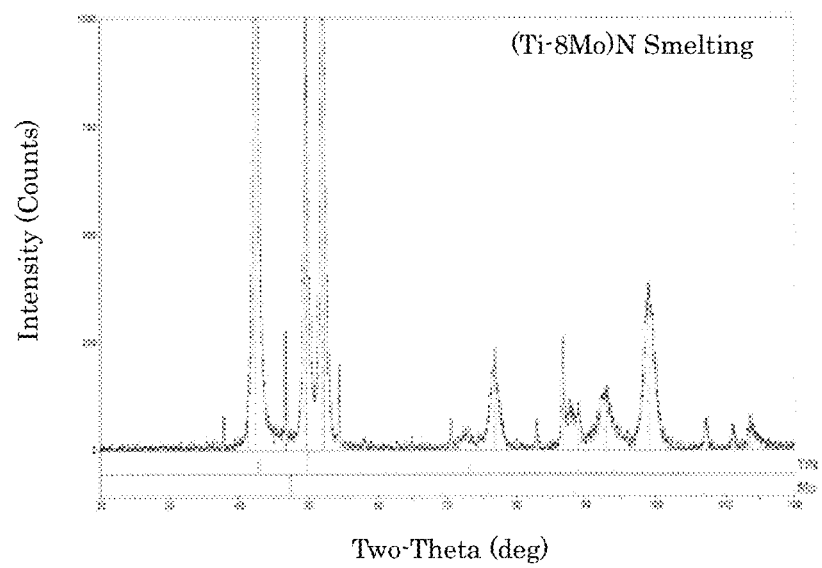
FIG. 9 is a graph illustrating the X-ray diffraction peak intensity of Example 2: a coating film using (Ti-8Mo)N (smelting) as a component.
Figure 10:
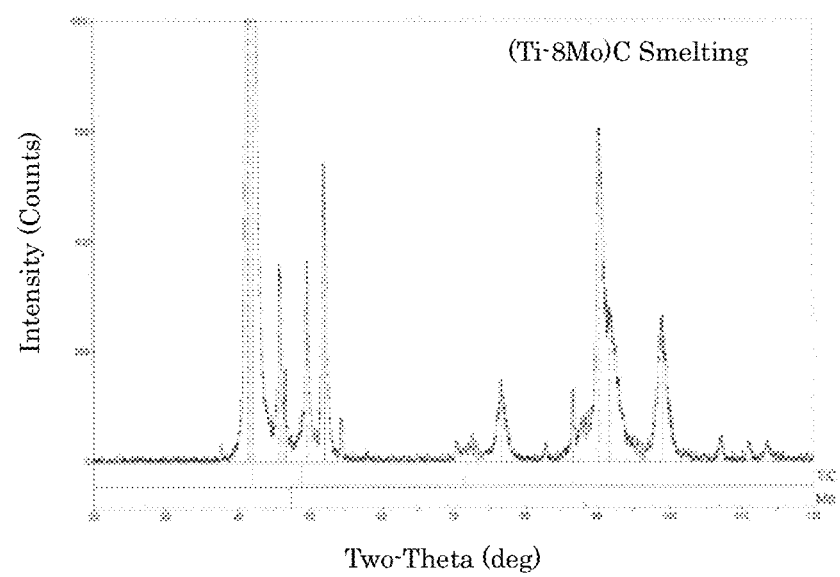
FIG. 10 is a graph illustrating the X-ray diffraction peak intensity of Example 6: a coating film using (Ti-8Mo)C (smelting) as a component.
Figure 11:
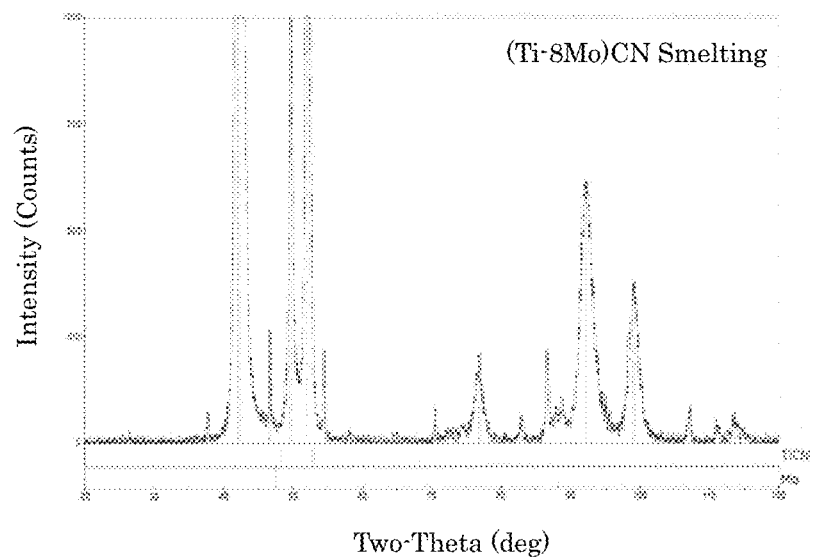
FIG. 11 is a graph illustrating the X-ray diffraction peak intensity of Example 10: a coating film using (Ti-8Mo)CN (smelting) as a component.
Figure 12:
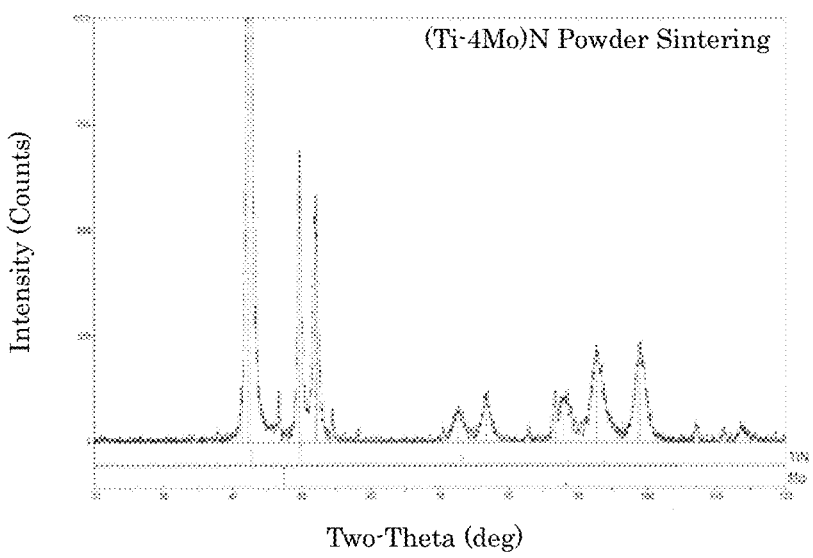
FIG. 12 is a graph illustrating the X-ray diffraction peak intensity of Example 13: a coating film using (Ti-4Mo)N (powder sintering) as a component.
Figure 13:
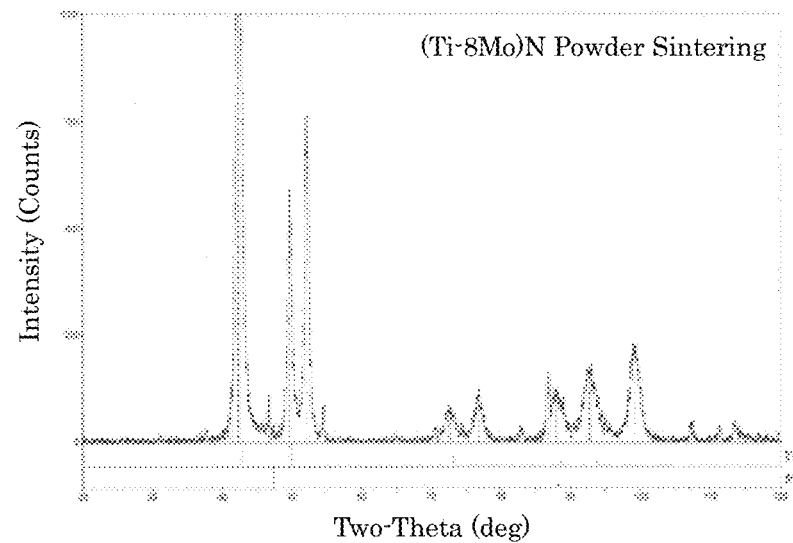
FIG. 13 is a graph illustrating the X-ray diffraction peak intensity of Example 14: a coating film using (Ti-8Mo)N (powder sintering) as a component.
Figure 14:
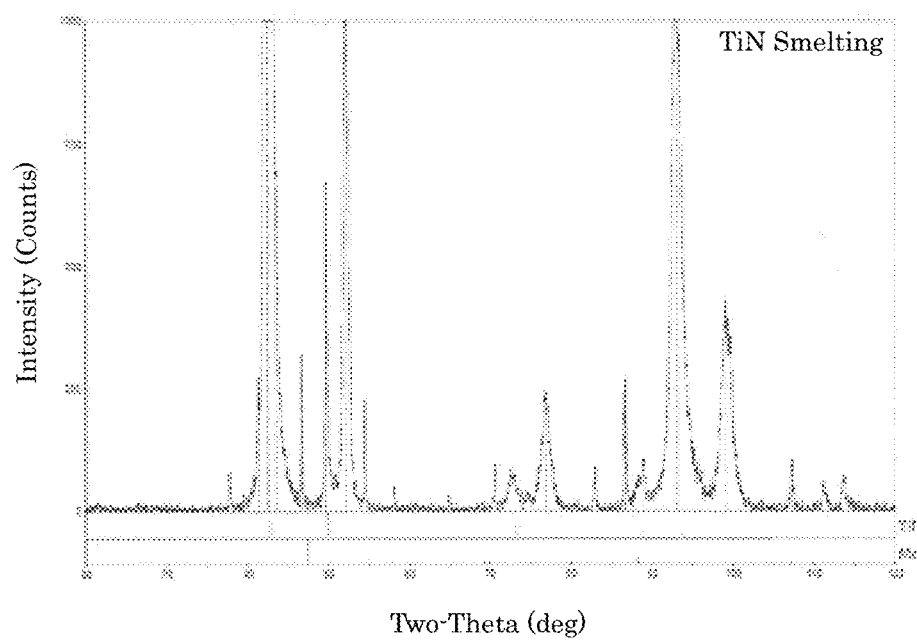
FIG. 14 is a graph illustrating the X-ray diffraction peak intensity of Comparative Example 1: a coating film using TiN (smelting) as a component.
Figure 15:
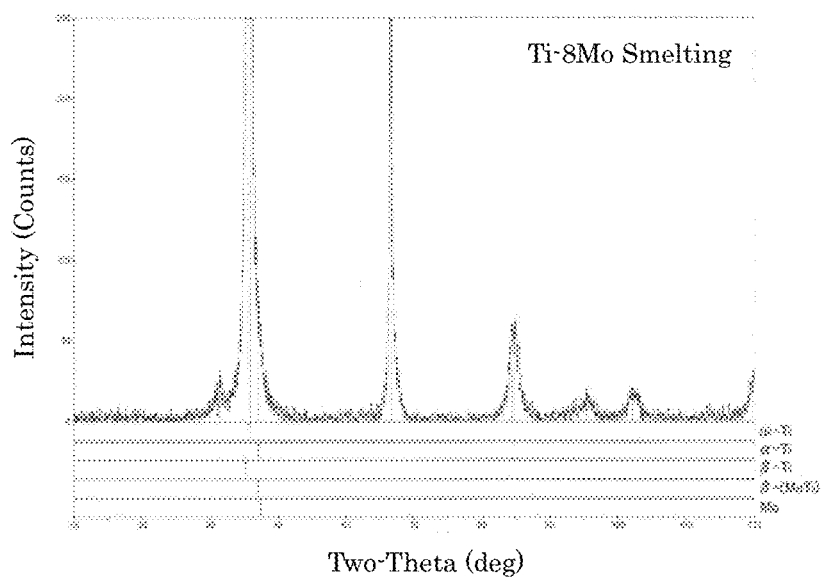
FIG. 15 is a graph illustrating the X-ray diffraction peak intensity of a target material using Ti-8Mo (smelting) as a component.

The surface structure illustrated in FIG. 8 revealed that the number of macroparticles (indicated by black dots) is the same in Examples 2, 6, 10, 13 and 14.

(8) Summary

In TiMoN (smelting), TiMoC (smelting) and TiMoCN (smelting), the film hardness is more excellent than in TiN (smelting), TiAlN (smelting), CrN (smelting) and AlCrN (smelting), and in TiMoN (powder sintering), TiMoC (powder sintering) and TiMoCN (powder sintering), the film hardness is more excellent than in TiN (powder sintering), TiAlN (powder sintering), CrN (powder sintering) and AlCrN (powder sintering), so that the target material can be used for the production by both smelting and powder sintering.

Among TiMoN (smelting), TiMoC (smelting) and TiMoCN (smelting), there is no large difference in the critical load (adhesiveness) or surface roughness, and among TiMoN (powder sintering), TiMoC (powder sintering) and TiMoCN (powder sintering), there is also no large difference in the critical load (adhesiveness) or surface roughness.

Figure 18:
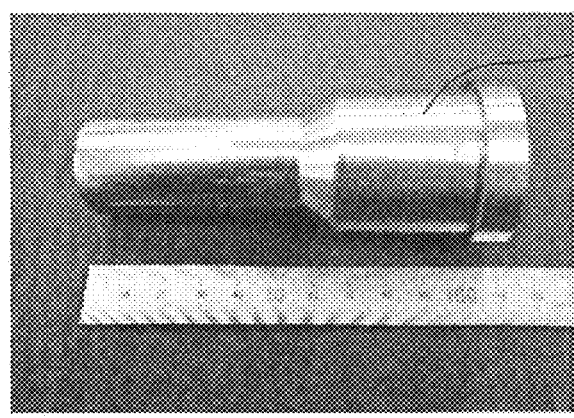
FIG. 18 is an outer appearance photograph illustrating a cold forging punch used for the film life study by punching (cold forging).
Figure 19:
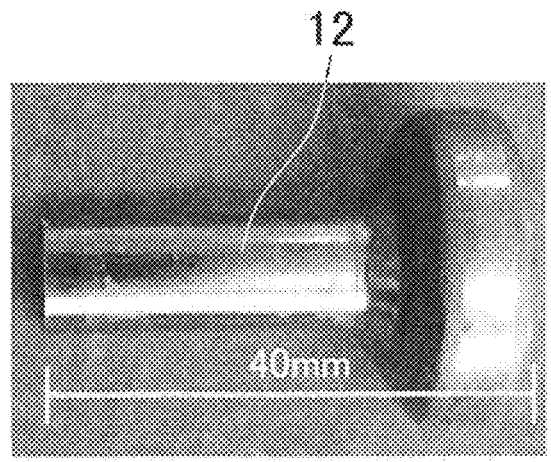
FIG. 19 is an outer appearance photograph illustrating the workpiece used in punching.
Figure 20A:
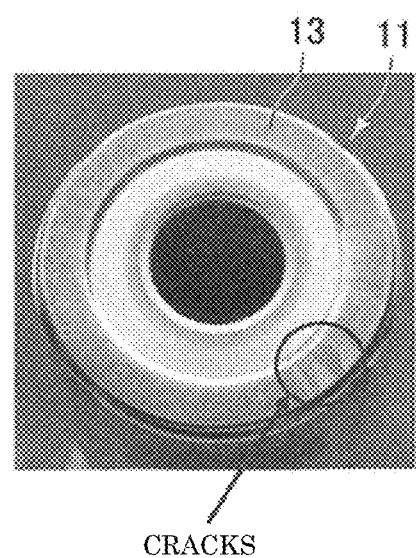
FIG. 20A is an outer appearance photograph illustrating the punch use surface of the cold forging punch of FIG. 18.
Figure 20B:
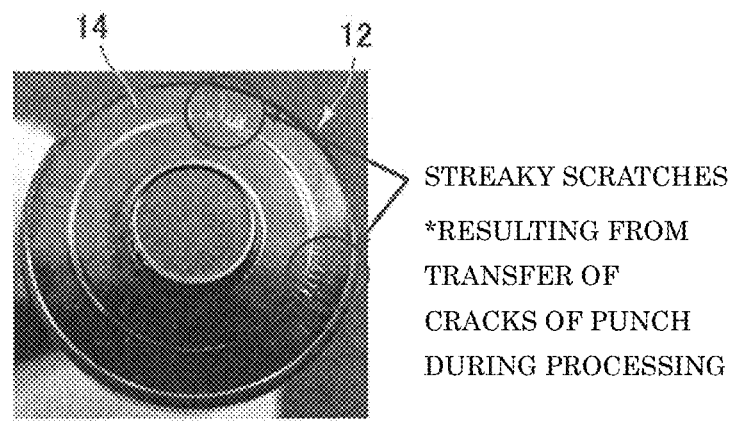
FIG. 20B is an outer appearance photograph illustrating the workpiece surface of the workpiece of FIG. 19.
Figure 21:
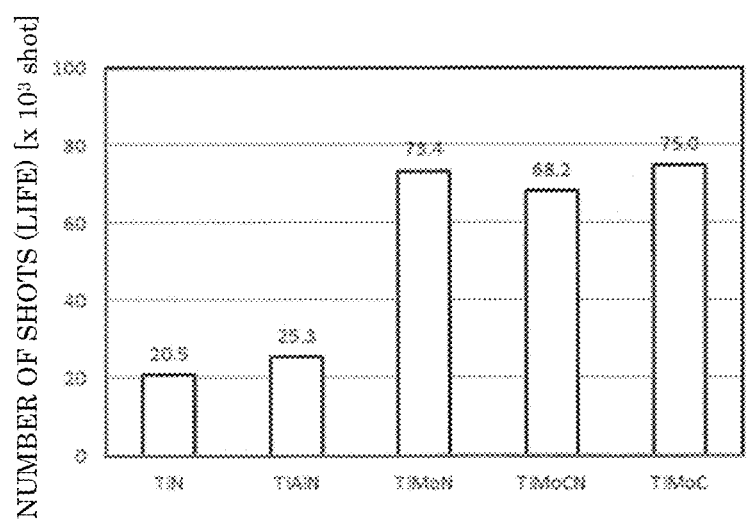
FIG. 21 is a graph illustrating the results of film life study by the type of film.

In addition to the evaluation methods above, a life study using a cold forging punch (material: HAP40, dimension: φ25 (punch diameter)×100 mm, hardness: 64 HRC) was performed. This study is to compare the film life, for example, when various coating films (targeted at 2 μm) were formed on a punch use surface of a cold forging punch 11 illustrated in FIG. 18 by using each of TiN (smelting) TiAlN (powder sintering) and Ti-8Mo (smelting) as a target material and cold forging was applied to a workpiece 12 (material: SKD11, phosphate coating treatment specification, dimension: φ25 (workpiece surface diameter)×φ9.5×40 mm, lubricant: forging oil) such as, for example, a shaft component with cap illustrated in FIG. 19. The life was judged, for example, based on the number of shots (number of processing operations) until streaky scratches illustrated in FIG. 20B, which are ascribable to the transfer of cracks of the coating film on the punch use surface 13 illustrated in FIG. 20A, became visible on the workpiece surface 14. FIG. 21 illustrates the results thereof.

With (Ti-8Mo)N (smelting), the number of processing operations (73,400 shot) was about 3.5 times compared to TiN and about 3 times compared to TiAlN. With (Ti-8Mo)C (smelting) and (Ti-8Mo)CN (smelting), the same results as those with (Ti-8Mo)N (smelting) were obtained.

As apparent from the discussions above, all of titanium alloy coating films of Examples have a main alloy structure of (Ti—Mo) but do not contain Mo as a single metal phase. Accordingly, hardness comparable to TiAlN can be obtained and, for example, the film life in punching (cold forging) can be enhanced. In particular, with respect to TiMoN series, a coating film having good adhesiveness to a base metal can be obtained. Furthermore, a titanium alloy target material manufactured by melting is used, so that a titanium alloy coating film having the above-described properties can be easily and simply produced.

In addition, each of the films of Examples 1 to 12 is also excellent in the recycling property, because, for example, it is formed using a target material obtained by a melting method insusceptible to refractory contamination and the coating film having a (Ti—Mo) component is not an alloy requiring a complicated composition.

Incidentally, Examples above are described by referring to a case where each coating film of $(Ti_{1-a}Mo_a)_{1-x}N_x$, $(Ti_{1-a}Mo_{a1-y}C_y$ and $(Ti_{1-a}Mo_a)_{1-x-y}C_yN_x$ is formed as a monolayer on a surface of the test piece, but the film layer configuration is not limited thereto and may be a composite layer in which two or more layers are formed using respective coating films of $(Ti_{1-a}Mo_a)_{1-x}N_x$, $(Ti_{1-a}Mo_a)_{1-y}C_y$ and $(Ti_{1-a}Mo_a)_{1-x-y}C_yN_x$, for example, by forming a first layer from $(Ti_{1-a}Mo_a)_{1-x}N_x$ and forming a second layer from $(Ti_{1-a}Mo_a)_{1-x-y}C_yN_x$ or $(Ti_{1-a}Mo_a)_{1-y}C_y$, or may be an inclined layer in which the content ratio of C and N is continuously changed, for example, by altering $(Ti_{1-a}Mo_a)_{1-x}N_x$ to $(Ti_{1-a}Mo_a)_{1-y}C_y$ via $(Ti_{1-a}Mo_a)_{1-x-y}C_yN_x$. It can be presumed by analogy that these configurations are also capable of enhancing the film life in punching (cold forging).

The titanium alloy coating film and titanium alloy target material according to Examples have been described hereinbefore, but the present invention is not limited to these embodiments and Examples, and appropriate changes can be made therein without departing from the gist of the present invention.

INDUSTRIAL APPLICABILITY

According to the present invention, a titanium alloy coating film ensuring excellent versatility in achieving high functionality of the coating film, moreover having excellent hardness and adhesiveness and therefore, being capable of successfully achieving life enhancement of a manufacturing component, and a titanium alloy target material used therefor can be provided.

While the invention has been described in detail and with reference to specific embodiments thereof, it will be apparent to one skilled in the art that various changes and modifications can be made therein without departing from the spirit and scope of the invention.

This application is based on Japanese Patent Application (Patent Application No. 2016-066573) filed on Mar. 29, 2016 and Japanese Patent Application (Patent Application No. 2017-057131) filed on Mar. 23, 2017, the contents of which are incorporated herein by way of reference.

DESCRIPTION OF REFERENCE NUMERALS AND SIGNS

11 Cold forging punch
12 Workpiece
13 Punch use surface
14 Workpiece surface

The invention claimed is:

1. A titanium alloy coating film represented by $(Ti_{1-a}Mo_a)_{1-x}N_x$,
    wherein each of a and x represents an atom ratio, the titanium alloy coating film as a whole satisfies $0.04 \leq a \leq 0.32$ and $0.40 \leq x \leq 0.60$,
    wherein a film hardness of the titanium alloy coating film satisfies at least a condition of 3,000 HV or more, and
    wherein a diffraction peak intensity in a plane of (111) of TiN obtained by an X-ray diffraction profile measurement is higher than a diffraction peak intensity in a plane of (200) of TiN.

2. The titanium alloy coating film according to claim 1, wherein, when an X-ray diffraction profile is measured on a surface of the titanium alloy coating film, a diffraction peak intensity attributed to a single metal phase of Mo is not detected.

3. A titanium alloy coating film represented by $(Ti_{1-a}Mo_a)_{1-y}C_y$,
    wherein each of a and y represents an atom ratio, the titanium alloy coating film as a whole satisfies $0.04 \leq a \leq 0.32$ and $0.40 \leq y \leq 0.60$, and a film hardness of the titanium alloy coating film satisfies at least a condition of 3,000 HV or more, and
    wherein a diffraction peak intensity in a plane of (111) of TiN obtained by an X-ray diffraction profile measurement is higher than a diffraction peak intensity in a plane of (200) of TiN.

4. The titanium alloy coating film according to claim 3, wherein, when an X-ray diffraction profile is measured on a surface of the titanium alloy coating film, a diffraction peak intensity attributed to a single metal phase of Mo is not detected.

5. A titanium alloy coating film represented by $(Ti_{1-a}Mo_a)_{1-x-y}C_yN_x$,
    wherein each of a, x and y represents an atom ratio, the titanium alloy coating film as a whole satisfies $0.04 \leq a \leq 0.32$, $0.20 \leq x,y \leq 0.40$, and $0.40 \leq 1-x-y \leq 0.60$, and a film hardness of the titanium alloy coating film satisfies at least a condition of 3,000 HV or more, and
    wherein a diffraction peak intensity in a plane of (111) of TiN obtained by an X-ray diffraction profile measurement is higher than a diffraction peak intensity in a plane of (200) of TiN.

6. The titanium alloy coating film according to claim 5, wherein when an X-ray diffraction profile is measured on a surface of the titanium alloy coating film, a diffraction peak intensity attributed to a single metal phase of Mo is not detected.

* * * * *